United States Patent
Kwon et al.

(10) Patent No.: US 6,566,197 B2
(45) Date of Patent: May 20, 2003

(54) METHOD FOR FABRICATING CONNECTION STRUCTURE BETWEEN SEGMENT TRANSISTOR AND MEMORY CELL REGION OF FLASH MEMORY DEVICE

(75) Inventors: Wook-Hyun Kwon, Cheongju (KR); Kee-Yeol Na, Cheongju (KR); Sang-Bum Lee, Cheongju (KR); Yong-Hee Kim, Cheongju (KR); Woong-Lim Choi, Cheongju (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 09/939,765

(22) Filed: Aug. 28, 2001

(65) Prior Publication Data

US 2002/0025635 A1 Feb. 28, 2002

(30) Foreign Application Priority Data

Aug. 29, 2000 (KR) ........................ 2000-50461

(51) Int. Cl.$^7$ ......................................... H01L 21/8247
(52) U.S. Cl. ........................ 438/258; 438/266; 438/280
(58) Field of Search ................................. 438/258, 266, 438/267, 280, 529, 549

(56) References Cited

U.S. PATENT DOCUMENTS 6,180,457 B1 * 1/2001 Shin et al. ................... 438/258
6,410,382 B1 * 6/2002 Huh et al. .................... 438/258

* cited by examiner

Primary Examiner—Chandra Chaudhari
(74) Attorney, Agent, or Firm—Birch, Stewart, Kolasch & Birch, LLP

(57) ABSTRACT

In a flash memory device, electrical connections between segment transistors and memory cells are accurately achieved by forming the segment transistors before forming the memory cells. When forming the segment transistors, a first impurity is implanted into a substrate to form a first source and a first drain. A second impurity is then implanted into the substrate to form a conductive line to be used as a common bit line for the memory cells, and simultaneously form a second source below the first source and a second drain below the first drain of the segment transistor. As such, the common bit lines of the memory cells and the second sources of the segment transistors are formed to be electrically connected together with more reliability.

8 Claims, 7 Drawing Sheets

METHOD FOR FABRICATING CONNECTION STRUCTURE BETWEEN SEGMENT TRANSISTOR AND MEMORY CELL REGION OF FLASH MEMORY DEVICE

BACKGROUND OF THE INVENTION

1. Field of the Invention

The present invention relates to a flash memory device, and more particularly, to a method for fabricating a connection structure to electrically connect elements of a flash memory device.

2. Description of the Background Art

A flash memory, being a non-volatile memory device, can be composed of highly integrated components that allow repetitive data storage by electrically re-writing thereto. As such, a flash memory can be used instead of magnetic memory devices, such as a hard disk for various storage device applications.

In order to further increase the integration of a cell array in the flash memory, several methods have been employed, whereby various bit lines are arranged to be commonly used by a plurality of components. The so-called "virtual ground method" employs a drain line and a source line that are alternately used. The so-called "common bit line common ground method" employs a single source line formed between two drain lines.

FIG. 1 depicts a connection structure between segment transistors and an array of memory cells in a flash memory device employing the common bit line common ground method in accordance with the conventional art. In FIG. 1, the cell array includes at least a first memory cell block B1 and a second memory cell block B2, both having the same structure and connected together symmetrically. It can be understood that additional memory cell blocks having identical configurations may be further connected to achieve the overall cell array configuration. Only two memory cell blocks are depicted for the sake of brevity in explaining the features of a conventional memory cell array.

In the first memory cell block B1, the gate electrodes 'G' of each transistor in a memory cell 'M' within the same array row are connected to a common cell word line 18. The sources 'S' of each transistor in a memory cell 'M' within the same array column are connected to a common source CS. Here, two adjacent transistors in two adjacent memory cells 'M' of the same array row are configured such that their sources are connected together. The common source CS is also connected with a source line 19, so that the same signal is applied to all the common sources CS in the first memory cell block B1. The drains 'D' of each transistor in a memory cell 'M' within the same array column are connected to a common bit line 15a. Each common bit line 15a has an end portion 17a.

The first memory cell block B1 further comprises a segment transistor 6a for each array column. Each segment transistor 6a has a source 10a connected with the end portion 17a of the common bit line 15a, a drain 12a connected with a data line 14, and a gate electrode 'G' connected with a common cell block word line 7a.

The second memory cell block B2 has the same configuration as the first memory cell block B1, and is connected to the first memory cell block B1 in a symmetrical and mirror-image manner. Namely, the drains of the segment transistors 6a at the end of the memory array columns of the first memory cell block B1 are connected to the drains of the segment transistors 6b at the end of the memory array columns of the second memory cell clock B2 via the data line 14 between the memory cell blocks B1, B2. The gate electrodes of the segment transistors 6b are connected to a common block word line 7b. The second memory block B2 also has common bit lines 15b connecting the drains of the transistors in memory cells of the same array column.

A conventional method for fabricating a connection structure (indicated as region 'A' in FIG. 1) between the segment transistors 6a, 6b and the memory cell blocks B1, B2 of the flash memory device in accordance with the conventional art will now be described with reference to FIGS. 2A through 4C.

FIGS. 2A through 2D are cross-sectional views showing a series of processes for fabricating common bit lines and memory cells of the flash memory device in accordance with the conventional art.

FIGS. 3A through 3C are cross-sectional views showing a series of processes for fabricating elements of the memory cells prior to forming the segment transistors of the flash memory device in accordance with the conventional art.

FIGS. 4A through 4C are cross-sectional views showing a series of processes for fabricating a connection structure between the segment transistors and the memory cells of the flash memory device in accordance with the conventional art.

As shown in FIG. 2A, after a first oxide film 21 is formed on the upper surface of a substrate 20, a first polysilicon layer 22 is formed at a portion where segment transistors are to be formed on the upper surface of the first oxide film 21. Then, an arsenic (As) or phosphorus (P) type impurity is ion-implanted into portions of the substrate not covered by the first polysilicon layer 22.

Thereafter, as shown in FIG. 2B, a diffusion process is performed at a high temperature to create an impurity diffusion layer on portions of the substrate not covered by the first polysilicon layer 22, to thus form the common bit lines 15a and 15b also shown in FIG. 1. A buried oxide film 21b is then formed on the common bit lines 15a, 15b.

Subsequently, as shown in FIG. 2C, a second oxide film 23 is deposited on the upper surface of the buried oxide film 21b by photolithography and selective etching. Here, if no misalignment or over-etching occurs during the photolithography or the etching process, the second oxide film 23 is accurately aligned on top of the buried oxide film 21b. However, if misalignment occurs during the photolithography or the etching process, the common bit lines 15a or 15b may be disconnected from the first oxide layer 21. As an example, FIG. 2D shows the common bit line 15b of the second memory cell block B2 being disconnected from the first oxide layer 21 due to misalignment during the photolithography and/or etching process.

Thereafter, as shown in FIG. 3A, a second polysilicon layer 24 is formed over the entire misaligned structure, and as shown in FIG. 3B, a second polysilicon pattern 24a is formed on the upper surface of the first polysilicon layer pattern 22 by performing photolithography and etching processes. Then, as shown in FIG. 3C, an insulation film 29 is formed on the upper surface of the second polysilicon layer pattern 24a and overlapping a portion of the second oxide film 23. Subsequently, a word line 28 for each memory cell block is formed on a portion of the second oxide film 23. This completes the conventional fabrication method of memory cell blocks, which will then be connected with segment transistors.

Thereafter, as shown in FIG. 4A, a photoresist 30 is formed over the word lines 28 by photolithography, while the insulation film 29, the second polysilicon layer pattern 24a, the first polysilicon layer 22, and the first oxide film 21 are all removed by etching.

However, referring back to FIG. 2D, because the second oxide film 23 was misaligned with the first polysilicon layer 22, the junction portions 27a and 27b of the memory cell blocks shown in FIG. 4A formed upon etching the insulation film 29, the second polysilicon layer pattern 24a, the first polysilicon layer 22, and the first oxide film 21, do not have the proper configuration. As such, the segment transistors to be subsequently formed between the memory cell blocks will not be properly connected with the common bit lines 15a and 15b of each memory cell block, as will be explained hereafter.

As shown in FIG. 4B, a third oxide film 33, acting as a gate oxide film, is deposited on the upper surface of the substrate 20 between the junction portions 27a and 27b of the memory cell blocks. Gate electrodes 31a and 31b are then respectively formed on the third oxide film 33. Then, insulating side wall spacers 32 are formed at the sides of the gate electrodes 31a and 31b. Subsequently, an impurity is ion-implanted into the semiconductor substrate 20 at both sides of and between the gate electrodes 31a and 32b, and is diffused to form sources 37a, 37b and a common drain 38. Thus, the segment transistor 6a properly connected with the first memory cell block B1 of FIG. 1 comprises gate electrode 31a, source 37a and common drain 38, while the segment transistor 6b not properly connected with the second memory block B2 comprises gate electrode 31b, source 37b and common drain 38.

Thereafter, as shown in FIG. 4C, a planarization layer 34 is deposited over the resulting structure on the substrate as shown in FIG. 4B. The planarization layer 34 is then selectively etched to form a contact hole 35 exposing the upper surface of the common drain 38. Then, a metal 36 is formed in the contact hole 35 and on a portion of the planarization layer 34 to cover the contact hole 35, to thereby complete the formation of and connection between the segment transistors 6a, 6b and the memory cell blocks in the conventional flash memory device.

However, the conventional method of formation and connection between the segment transistors and the memory cell blocks in the conventional flash memory device have some problems. Process misalignment during fabrication causes improper electrical connections between the segment transistors and the memory cell blocks as explained with regard to FIGS. 2A through 4C above. As such, a process margin between the segment transistors and the common bit lines needs to be established during fabrication to allow for a margin of error and to take into consideration any possible misalignment during fabrication. However, the provision of process margins undesirably increases the overall footprint or required area of the flash memory device.

SUMMARY OF THE INVENTION

The present invention provides a method for fabricating a connection structure between a segment transistor and a memory cell of a flash memory device, allowing precise electrical connections therebetween to thus improve flash memory product reliability.

To achieve these and other advantages, and in accordance with the purpose of the present invention as embodied and broadly described herein, a method for fabricating a connection structure between a segment transistor and a memory cell of a flash memory device includes the steps of: forming a first gate oxide film on the upper surface of a semiconductor substrate having a segment transistor region and a memory cell region; forming gate electrodes for a segment transistor on the first gate oxide at the segment transistor region; forming a photoresist pattern on the first gate oxide film of the memory cell region; ion-implanting a first impurity into the semiconductor substrate at the segment transistor region by using the gate electrodes of the segment transistors as a self-alignment mask, to form a first source and a first drain for the segment transistor; and ion-implanting a second impurity on the whole surface of the semiconductor substrate by using the gate electrode of the segment transistor as a mask, to form a common bit line and a common source inside the semiconductor substrate of the memory cell region, and simultaneously forming a second source and a second drain below the first source and below the first drain of the segment transistor, respectively.

The foregoing and other features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention, and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
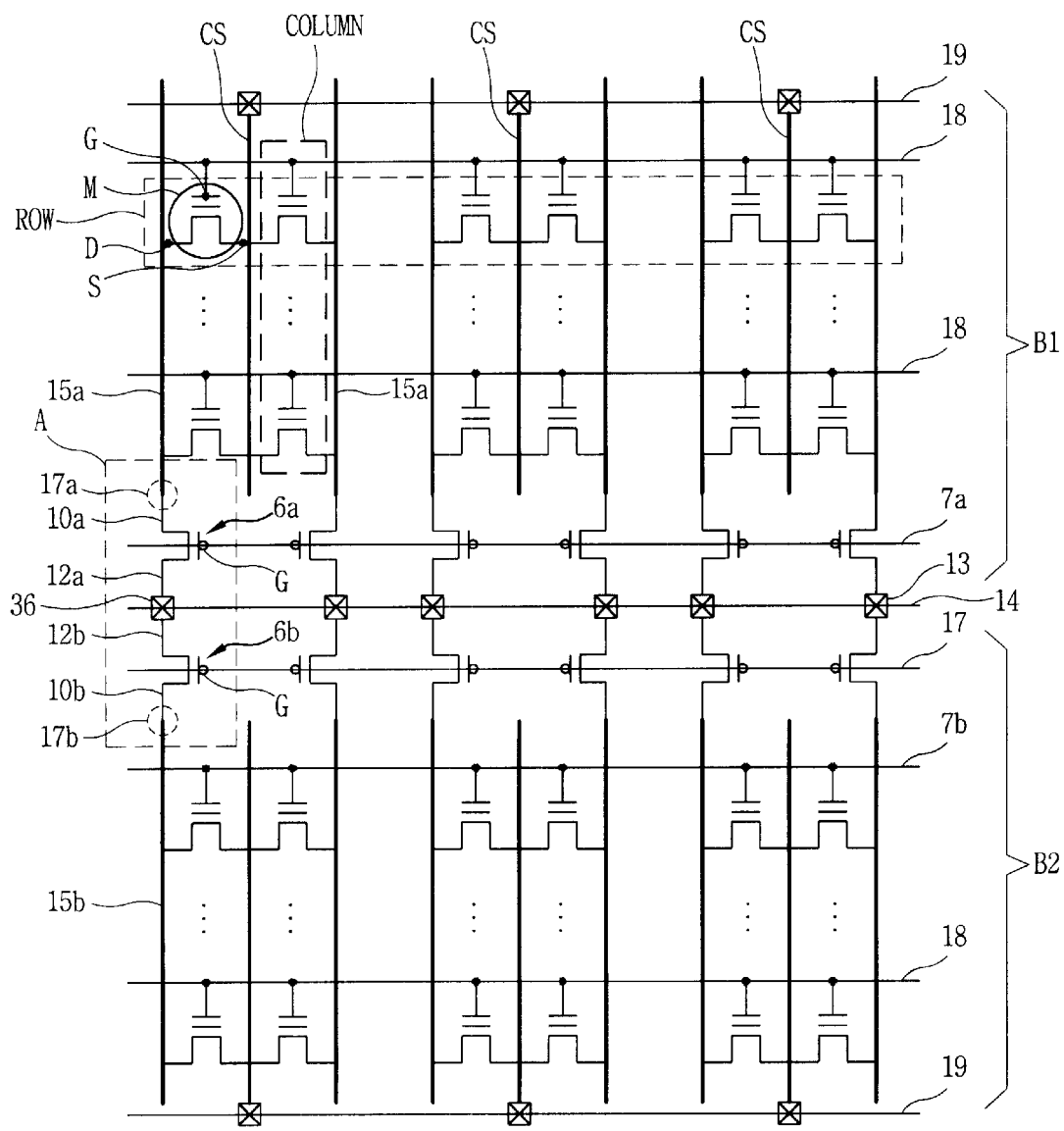
FIG. 1 is a plan view of a memory cell array having segment transistors connected to memory cells of a flash memory device in accordance with the conventional art.
Figure 2A:
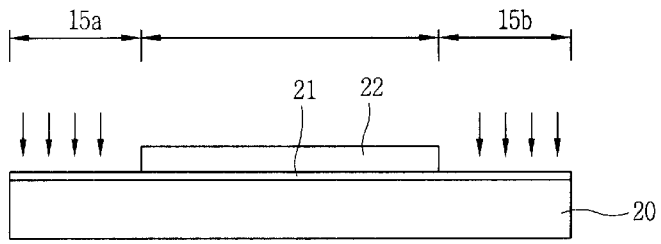
FIGS. 2A through 2D are cross-sectional views showing a series of processes for fabricating common bit lines and memory cells of the flash memory device in accordance with the conventional art.
Figure 2B:
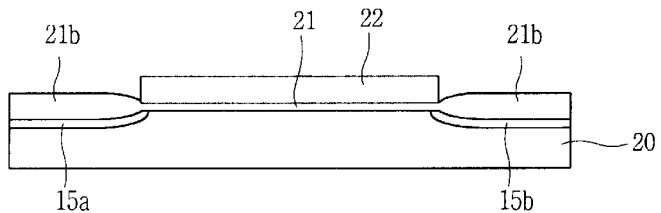
Figure 2C:
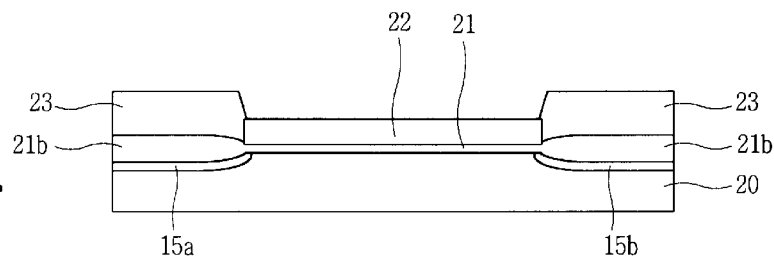
Figure 2D:
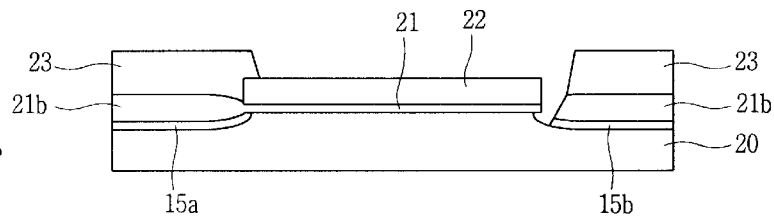
Figure 3A:
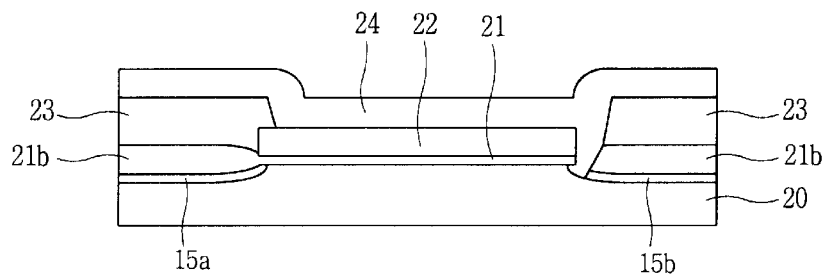
FIGS. 3A through 3C are cross-sectional views showing a series of processes for fabricating elements of the memory cells prior to forming the segment transistors of the flash memory device in accordance with the conventional art.
Figure 3B:
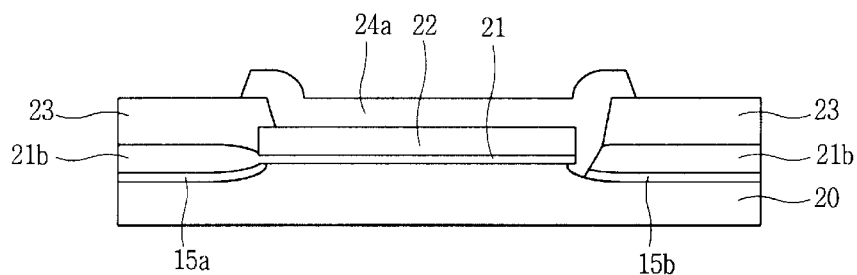
Figure 3C:
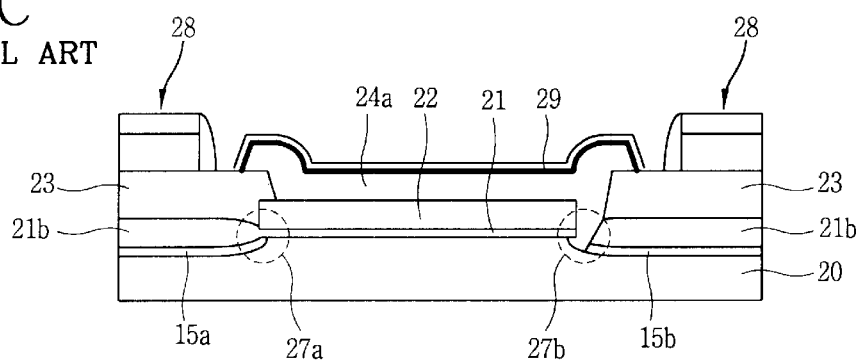
Figure 4A:
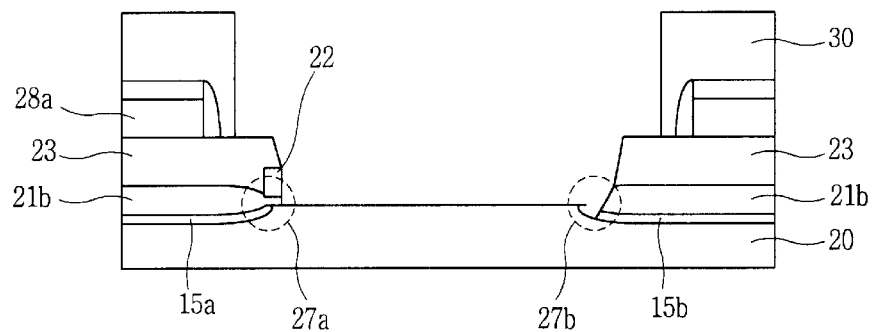
FIGS. 4A through 4C are cross-sectional views showing a series of processes for fabricating a connection structure between the segment transistors and the memory cells of the flash memory device in accordance with the conventional art.
Figure 4B:
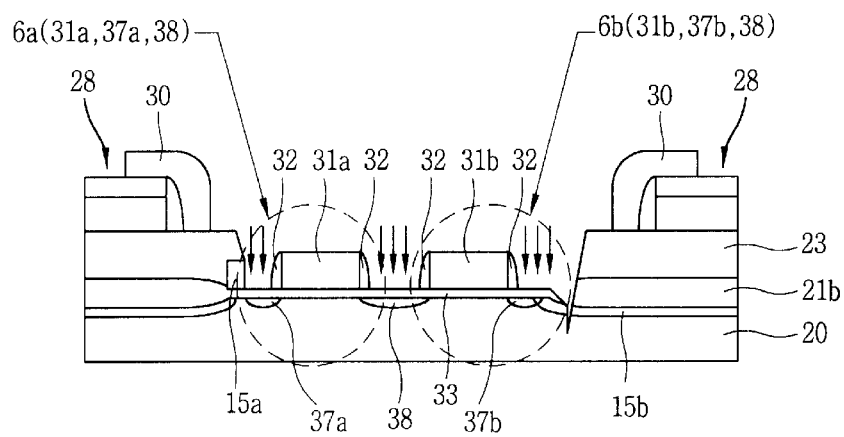
Figure 4C:
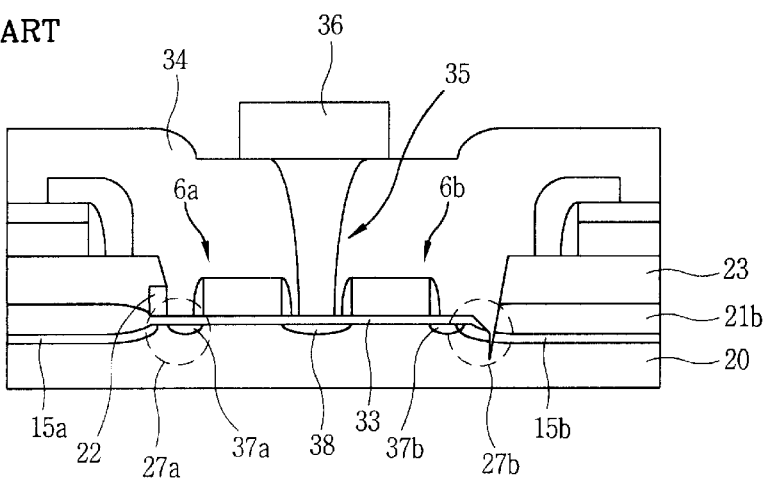
Figure 5A:
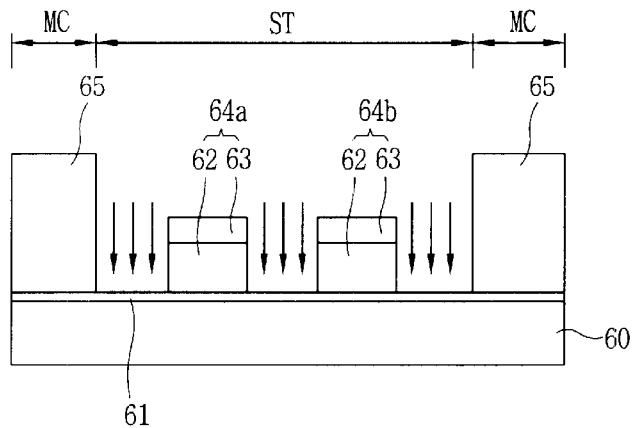
FIGS. 5A through 5C are cross-sectional views showing a series of processes for fabricating segment transistors prior to forming the memory cells of a flash memory device in accordance with the present invention.
Figure 5B:
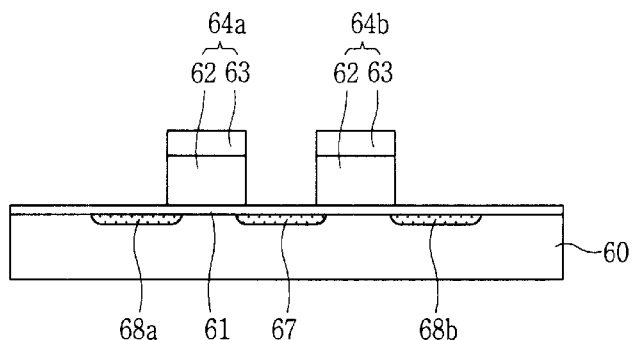
Figure 5C:
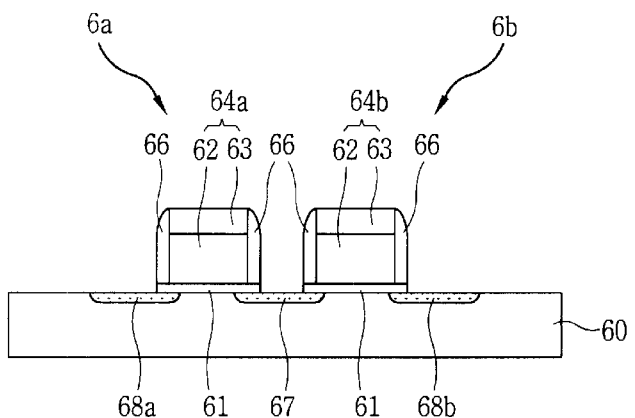

FIGS. 5A through 5C are cross-sectional views showing a series of processes for fabricating segment transistors prior to forming the memory cells of a flash memory device in accordance with the present invention;

As shown in FIG. 5A, a first gate oxide film 61, as a gate oxide film for a segment transistor, is formed on the upper surface of a semiconductor substrate 60 having a segment transistor region ST and a memory cell region MC. Thereafter, a first polysilicon layer 62 and an oxidation inhibiting film 63 are formed on the gate oxide film 61. The first polysilicon layer 62 is formed to have low resistance and very high electrical conductivity. Next, the first polysilicon layer 62 and the oxidation inhibiting film 63 are patterned by photolithography and an etching process, to thus form gate electrodes 64a and 64b for two segment transistors on the first gate oxide film 61. Then, a photoresist pattern 65 is formed on the semiconductor substrate 60 at the memory cell regions. Subsequently, a first impurity is ion-implanted into the segment transistor region ST of the semiconductor substrate 60 by using the photoresist pattern 65 and the gate electrodes 64a and 64b as an ion-implantation mask.

Then, as shown FIG. 5B, a first source 68a and a first drain 67 are respectively formed in the substrate 60 at both sides of the gate electrode 64a, and likewise, a first source 68b and a first drain 67 are respectively formed at both sides of the gate electrode 64b. Thereafter, the photoresist pattern 65 is removed. Here, the segment transistors to be formed are connected together at their drains. As such, the first drain 67 is a common drain for the two segment transistors to be formed.

Thereafter, as shown in FIG. 5C, side wall spacers 66 are formed at the sides of the gate electrodes 64a and 64b. To form the side wall spacers, an insulation layer is first formed over the gate electrodes 64a and 64b, and the first gate oxide film 61. Then, anisotropic etching is performed without using a mask, so that the first gate oxide film 61 is over-etched and naturally removed. Here, the side wall spacer 66 is preferably formed of a nitride film to minimize oxidation. As such, the process for fabricating the first segment transistor 6a and the is second segment transistor 6b is completed.

Figure 6A:
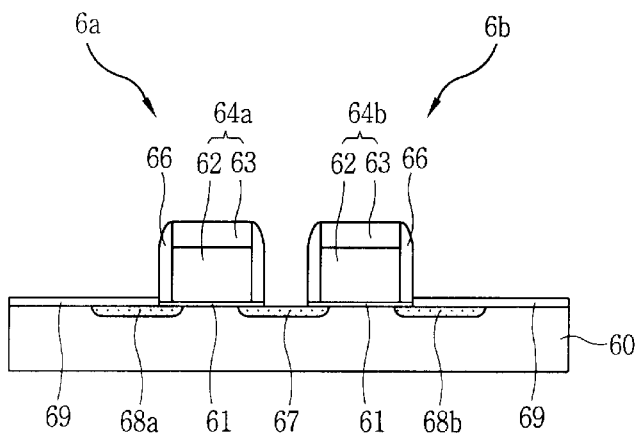
FIGS. 6A and 6B are cross-sectional views showing a process of fabricating gate electrodes and side wall spacers of the segment transistors in accordance with the present invention.
Figure 6B:
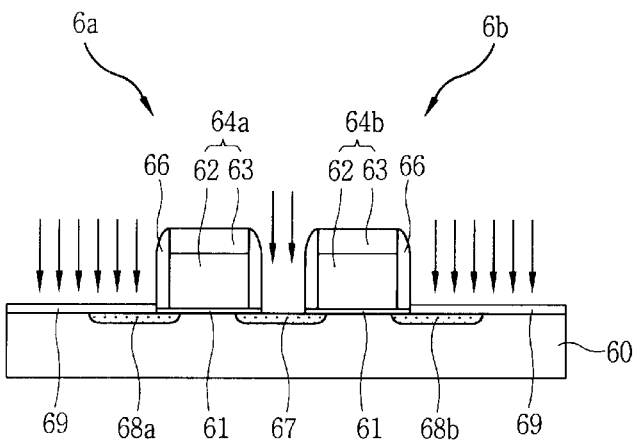
Figure 7A:
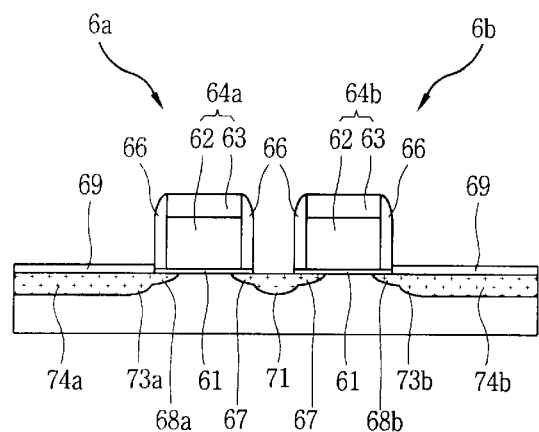
FIGS. 7A and 7B are cross-sectional views showing a process of fabricating a connection structure between the segment transistors and the memory cells in the flash memory device in accordance with the present invention.
Figure 7B:
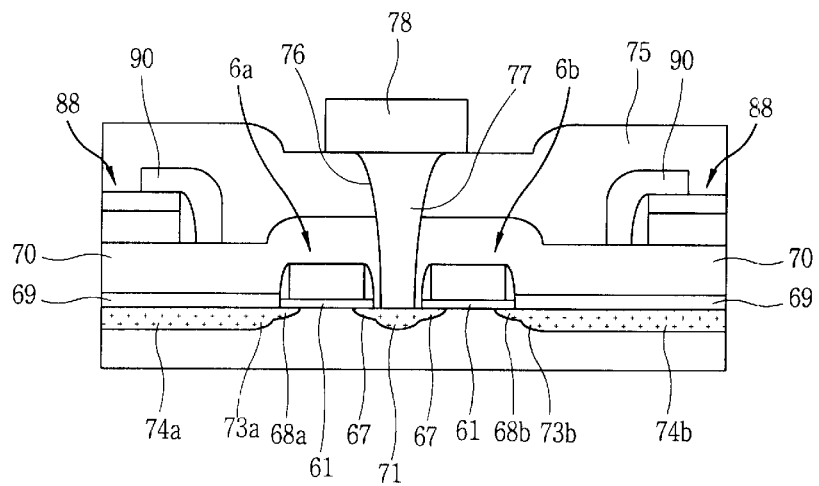

FIGS. 6A and 6B are cross-sectional views showing a process of fabricating gate electrodes 64a, 64b and side wall spacers 66 of the segment transistors 6a, 6b in accordance with the present invention, and FIGS. 7A and 7B are cross-sectional view showing a process of fabricating a connection structure between the segment transistors and the memory cells in the flash memory device in accordance with the present invention.

As shown in FIG. 6A, a second gate oxide film 69 is formed at the memory cell regions of the semiconductor substrate 60, and a floating gate electrode (not shown) for a memory cell is formed at the memory cell region. Here, it should be noted that the first gate oxide film 61 and the second gate oxide film 69 are formed independently of one another. The second gate oxide film 69 has a different thickness than that of the first gate oxide film 61 previously formed under the gate electrodes 64a, 64b. Preferably, the second gate oxide film 69 has a thickness greater than that of the first gate oxide film 61.

Thereafter, as shown in FIG. 6B, a second impurity is ion-implanted into the semiconductor substrate 60 using self-alignment characteristics of the floating gate (not shown) of a memory cell, of the gate electrodes 64a and 64b, and of the side wall spacers 66. Here, the gate electrodes 64a and 64b, and the side wall spacers 66 are used as an ion-implantation mask.

As shown in FIG. 7A, the implanted second impurities form a common bit line 74a, 74b for each memory cell on the semiconductor substrate 60, and the second impurities also form a second source 73a, 73b and a second drain 71 for each segment transistor 6a, 6b. Here, the first and second segment transistors 6a, 6b are connected together at their drains, thus the second drain 71 formed under and electrically connected with the first drain 67 together form a common drain for both segment transistors 6a, 6b. Also, the common bit lines 74a, 74b and the second sources 73a, 73b are simultaneously formed to be electrically connected together. Accordingly, the common bit line 74a of the memory cell and the first and second sources 68a, 73a of the first segment transistor 6a are electrically connected with more reliability. Similarly, the common bit line 74b of the memory cell and the first and second sources 68b, 73b of the second segment transistor 6b are electrically connected with more reliability. In other words, because the size of the sources for each segment transistor 6a, 6b is increased by forming a first source and then a second source thereunder, and because the common bit lines are formed simultaneously with the first and second sources, the memory cells and the segment transistors 6a, 6b are electrically connected with more reliability.

Thereafter, as shown in FIG. 7B, an oxide layer 70 is formed over the memory cell regions MC and the segment transistor region ST A word line structure 88 is formed on the oxide layer 70 at the memory cell regions MC, and a photoresist 90 is formed over a portion of the word line structure 88 to complete the memory cells. Thereafter, a planarization layer 75 is formed over the memory cell regions MC and the segment transistor region ST. Then, a contact hole 76 is formed through the planarization layer 75 and the oxide layer 70 to expose the first and second drains 67, 71 between the first and second segment transistors 6a, 6b. Then, the contact hole 76 is filled with a metal contact 77 and a metal wiring 78 is formed on the metal contact 77 above the planarization layer 75 to complete the flash memory device according to the present invention.

The connection structure between the segment transistors and the memory cells of the flash memory device according to the present invention has the following advantages. First, when impurities are ion-implanted to fabricate the common bit lines of the memory cells, impurities are also ion-implanted to form secondary source regions of the segment transistors, allowing the common bit lines and the sources of the segment transistors to be electrically connected. As such, problems due to possible misalignments during processing and the need for process margins can be reduced. Second, since the reliability of the electrical connections between the memory cells and the segment transistors of the flash memory device is improved, defects within the flash memory device can be reduced. Third, since the contact area between the common bit lines of the memory cells and the sources the segment transistors is greater than that of the conventional art, contact resistance between the common bit lines and the memory cells can be reduced. Lastly, since the gate oxide film of the segment transistors and the gate oxide film for forming the memory cells are independently formed, the electrical characteristics of the segment transistors can be easily varied according to users' demands, and thus, the flash memory device according to the present invention can be adapted to have a wide variety of applications.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for fabricating a connection structure between a segment transistor and a cell region of a flash memory device, comprising the steps of:

forming a first gate oxide film on a semiconductor substrate having a segment transistor region and a memory cell region;

forming a gate electrode for a segment transistor on the first gate oxide film at the segment transistor region;

forming a photoresist pattern on the first gate oxide film at the memory cell region;

ion-implanting a first impurity into the segment transistor region of the semiconductor substrate by using the gate electrode as a self-alignment mask, to form a first source and a first drain of the segment transistor;

ion-implanting a second impurity into semiconductor substrate by using the photoresist pattern and the gate electrode of the segment transistor as a mask, to form a common bit line and a common source at the memory cell region, and simultaneously forming a second source and a second drain below the first source and below the first drain of the segment transistor, respectively, wherein the second source of the segment transistor and the common bit line of the memory cell region are electrically connected.

2. The method according to claim 1, further comprising a step of forming an insulating side wall spacer at both sides of the gate electrode of the segment transistor.

3. The method according to claim 2, wherein the insulating side wall spacer comprises a nitride film.

4. The method according to claim 2, wherein after the side wall spacer is formed, a second gate oxide film is formed on the semiconductor substrate at the memory cell region.

5. The method according to claim 4, wherein the second gate oxide film is formed to have a different thickness than a thickness of the first gate oxide film.

6. The method according to claim 1, wherein the source of the segment transistor and the common bit line of the memory cell region are connected during the second impurity ion-implantation.

7. A method of forming a flash memory device comprising:

forming a semiconductor transistor over a substrate, the semiconductor transistor having a gate electrode, a first source region and a first drain region;

implanting impurities into the substrate to form a second source region beneath and electrically connected with the first source region, and simultaneously form a conductive line extending from and electrically connected with the first and second sources; and forming a memory cell adjacent to the semiconductor transistor the memory cell being electrically connected with the conductive line, and electrically connected with the semiconductor transistor via the conductive line.

8. A method of forming a flash memory device comprising:

forming a gate electrode structure of a semiconductor transistor over a substrate;

implanting a first impurity into the substrate to form a first source and a first drain of the semiconductor transistor;

implanting a second impurity into the substrate to simultaneously form a second source under the first source, a second drain under the first drain, and a conductive line extending from and electrically connected with the first and second sources;

forming a memory cell adjacent to the semiconductor transistor, the memory cell being electrically connected with the conductive line, and electrically connected with the semiconductor transistor via the conductive line.

* * * * *